United States Patent
Pang et al.

[11] Patent Number: 5,093,833
[45] Date of Patent: Mar. 3, 1992

[54] OPTICAL PULSE GENERATOR

[75] Inventors: L. Y. Pang, Tewksbury; Emily S. Kintzer, Arlington; James G. Fujimoto, Cambridge, all of Mass.

[73] Assignee: Massachusetts Institute of Technology, Cambridge, Mass.

[21] Appl. No.: 656,813

[22] Filed: Feb. 15, 1991

[51] Int. Cl.$^5$ ............................................... H01S 3/13
[52] U.S. Cl. .............................. 372/30; 372/25; 372/27; 372/20
[58] Field of Search ................ 372/30, 97, 25, 20

[56] References Cited
U.S. PATENT DOCUMENTS

4,709,368 11/1987 Fukuda et al. .................. 372/97
4,922,498 5/1990 Kearsley et al. ................. 372/25

*Primary Examiner*—Leon Scott, Jr.
*Attorney, Agent, or Firm*—Wolf, Greenfield & Sacks

[57] ABSTRACT

A fast rise time optical pulse generator is provided which utilizes a laser cavity having a gain medium with a pair of cavity arms extending therefrom, each cavity arm having a feedback element at its distal end. The gain medium has the property that if optical waves enter the gain medium from the two arms simultaneously, the gain is reduced. This will generally occur as a result of a gain saturation effect such as spatial hole burning. Since the gain reduction does not occur for pulses of a length equal to the length of the laser cavity or for odd submultiples of such pulses, outputs are obtained at one of these pulse lengths. Various means are provided for tuning the system to the desire harmonic.

29 Claims, 3 Drawing Sheets

OPTICAL PULSE GENERATOR

FIELD OF THE INVENTION

This invention relates to optical pulse generators and more particularly to a passive generator of fast rise time optical square waves.

BACKGROUND OF THE INVENTION

In applications such as optical computing and optical communications, information is often encoded as pulses of light. Since these systems require optical clock pulses to operate, a source of optical square waves, preferably fast rise time optical square waves, is required so that such systems can be implemented as an all optical system. At this time, most techniques for generating optical square wave pulse trains are active techniques relying on the use of external modulators, RF oscillators or electrical feedback schemes to, for example, control a diode optical source. These techniques are, however, relatively complicated and expensive, are difficult to control and involve electrical switching which limits available rise time and frequency. A simpler, passive, all optical system would, therefore, be preferable.

At this time, passive generation of near-square wave optical pulse trains has been demonstrated only using polarization switching of diode lasers. This technique is, however, limited to laser cavities in which the gain and loss are relatively insensitive to the state of polarization of the light. The rise time in such devices is also not as rapid as might be desired for true square wave operation and the contrast ratio between on and off intensities is lower than might be desired for some applications.

A need, therefore, exists for an improved, all optical generator for fast rise time square wave optical pulse trains, which generator is relatively simple and inexpensive to construct and relatively easy to tune and control. It would also be desirable in some applications if such generator could be constructed to be compact.

SUMMARY OF THE INVENTION

In accordance with the above, this invention provides an optical pulse generator for pulses of a desired pulse width. The generator consists of a laser gain medium in a cavity with two arms, where each arm contains an optical feedback element. The arms may be formed by a length of free space or may be formed by an optical waveguide. The feedback element may be a retroreflecting mirror at the far end of the cavity arm or feedback may be effected by having the cavity arm form a loop. The generator is configured so that an optical wave in the cavity which enters either arm from the gain medium is then fed back to the gain medium where it undergoes amplification and then subsequently enters the other arm of the cavity. Furthermore, the gain has the property that if optical waves enter the gain medium from the two arms simultaneously, then the gain is reduced. The laser cavity has a length substantially equal to an odd multiple (h) of the pulse width and the relative lengths of the cavity arms are such that the gain medium is at a point in the laser cavity spaced from the center by a multiple of the pulse width which may be zero, the number of points in the laser cavity at which the medium may be located being no greater than h. The cavity contains at least one output coupler which may be coincident with a cavity arm feedback element. The cavity may further contain collimating elements such as an object lens, mode matching elements such as a cylindrical lens, and optical frequency control elements such as an optical filter.

In the preferred embodiment, the gain medium consists of a diode laser or diode laser array having a broad transverse dimension and with a high-reflection coating on the rear facet and an anti-reflection coating on the front facet. The two cavity arms extend from the front facet at angles of $+\theta$ and $-\theta$, respectively, from an axis normal to the facet. Two optical waves entering the gain medium simultaneously from the angled arms will form an interference pattern in the gain medium. The interference pattern causes gain reduction due to spatial hole burning. The angle is preferably in the range from 6° to 25°. The angle determines the separation of the fringes in the interference pattern in the gain medium. The fringes must have sufficient separation so that the resultant spatial hole burning will persist in the presence of diffusion processes. The width and length of the gain medium are chosen so that $w \geq (2l/n)\sin\theta$, where w is the width of the gain medium, l is the length of the gain medium and n is the index of refraction of the gain medium. Furthermore, the width of the gain medium should be greater than the width of one fringe of the interference pattern.

In the preferred embodiment, the two arms extend in free space and are terminated by retroreflecting mirrors, of which one mirror is a high reflector and the other mirror is a partial reflector. The partial reflector also serves as a means for output coupling. The odd harmonic of the square wave, and thus the pulse width, for a laser cavity of a given length may be controlled by, for example, adjusting the angle of the output coupler and/or the high reflection mirror at distal ends of the cavity arms. Tuning may also be controlled by the use of an external cavity extending from the output coupler or by a partially reflecting element inserted in one of the cavity arms in such a way as to form a subcavity.

For other embodiments, the two arms may be formed by an optical waveguide which may be fabricated on the chip containing the gain medium, or could be an external optical fiber. In order to reduce the physical lengths of the arms, and thus to provide a more compact construction, either one or both of the arms may be formed by a coiled optical waveguide, for example, a coiled optical fiber.

Further, while for the preferred embodiment the gain medium has a high reflection coated rear facet and an anti-reflection coating on its front facet, both facets may have anti-reflection coatings, with the laser cavity having a figure eight loop configuration or an X-shaped configuration. With a suitable gain medium, a linear cavity may also be utilized.

The foregoing and other objects, features and advantages of the invention will be apparent from the following more particular description of preferred embodiments of the invention as illustrated in the accompanying drawings.

DETAILED DESCRIPTION

Figure 1:
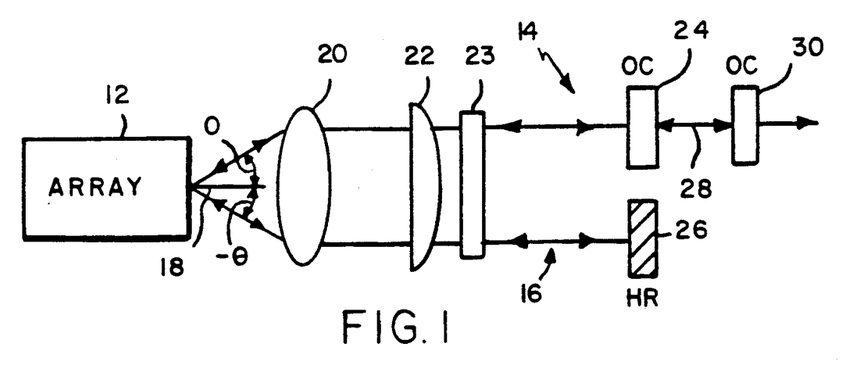
FIG. 1 is a schematic block diagram of an optical system suitable for use in practicing the teachings of this invention.
Figure 2:
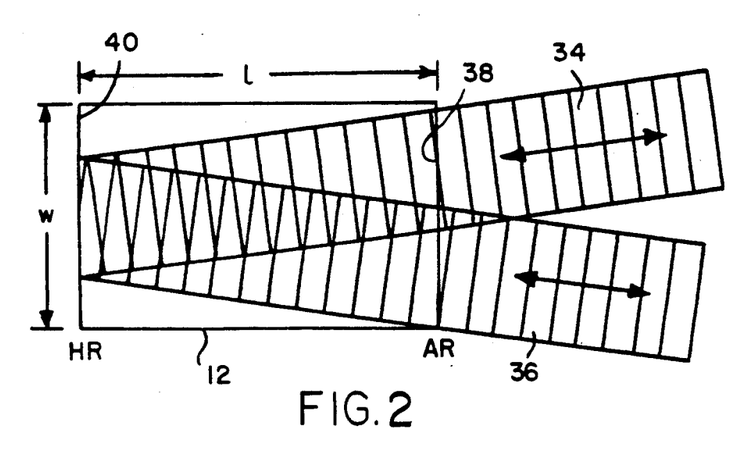
FIG. 2 is a diagram illustrating the incident and reflected light beams in the laser gain medium of FIG. 1 at a point in time.

FIGS. 1 and 2 illustrate an optical system 10 which may be utilized for practicing the teachings of this invention. The system includes a laser gain medium 12 which has a broad transverse dimension. First and second cavity arms 14 and 16 extend from the gain medium at equal but opposite angles $+\theta$ and $-\theta$, respectively. The angle $\theta$ may be measured with respect to a collinear axis 18 extending perpendicular to the front facet of laser medium 12. The lengths of cavity arm 14 and 16 are substantially greater than the length of medium 12.

The output from gain medium 12 is passed through object lens 20 which collimates the divergent output from medium 12, through a cylindrical lens 22 which performs beam shaping to mode match the medium to the cavity arms, and through an optical filter 23 which restricts the bandwidth or controls the peak optical wavelengths of the output spectral content. While filter 23 may be in both cavity arms as shown, it is preferably in only a single one of the cavity arms. Filter 23 may not be required where the laser medium 12 provides a narrow band output, but may be required in other applications. Cavity arm 14 is terminated at its distal end by an output coupler 24 and cavity arm 16 is terminated at its distal end in a high reflection mirror 26. For the embodiment shown, output coupler 24 feeds into an external cavity 28 which is terminated at its distal end by a second output coupler 30, the system output being taken at the output from coupler 30. As will be discussed later, external cavity 28 is one possible means of tuning the device and the existence of this cavity is not a limitation on the invention.

FIG. 2 is an enlarged view of laser gain medium 12. From this figure, it is seen that the light beams 34 and 36 corresponding to cavity arms 14 and 16, respectively, are beam fronts which travel in both directions into, through and out of gain medium 12. The angles at which the beam fronts enter and leave the gain medium are the angles $+\theta$ and $-\theta$, respectively. While to simplify FIG. 2 the beams are shown as being in the same directions in the gain medium, the beams would actually be bent slightly for most gain mediums due to differences in refractive indices between the gain medium and the medium for the cavity arms.

Medium 12 has a generally rectangular configuration of length 1 and width w. The front facet 38 of the medium, the facet adjacent arms 14 and 16, has an antireflection coating and the rear facet 40 of the medium has a high reflection coating. Thus, an optical beam 34 traveling toward medium 12 enters the medium through facet 38, passes through the medium, is reflected off facet 40 at the angle of beam 36, passes through the medium at this angle and out the medium as beam 36. An optical beam entering medium 12 in the direction of beam 36 follows the same path described above in the opposite direction.

From the above, it can be seen that when light beams are passing through medium 12 from both arms 14 and 16 at the same time, an interference pattern develops in the medium. If the width w of the gain medium is wide enough, the overlapping beams in the interference pattern may result in a spatial hole burning pattern, reinforcements and cancellations in the interference pattern resulting in light spots and dark spots in the medium. In such patterns, the light areas use more gain from the gain medium than the dark areas and, when spatial hole burning occurs, the light areas "use up" or saturate the gain of the medium. Therefore, when the medium is operating with spatial hole burning, this is an inefficient mode of operation.

Lasers tend to work in a mode of operation in which gain is highest. Since standing wave operation frequently results in spatial hole burning, this mode is normally not favored. Therefore, the laser will operate with a square wave output if the gain medium is suitably positioned.

Unless there is adequate separation between light and dark areas in an interference pattern, the hole burning pattern will not persist. For most diode laser gain media, the hole burning effect cannot be maintained where the incident beams are collinear with axis 18 (where the angle $\theta$ is zero) although this is not true for all gain media. Where the gain medium is a diode laser array, and in particular where the gain medium is a 40 stripe MQW GaAlAS laser array, preferably with a 400 micrometer wide active area, spatial hole burning persists for $\theta$ angles in the 6° to 25° range. While it is possible that the effect can persist outside of this range, the effect has been determined experimentally to persist when the angle $\theta$ is in this range, and this is believed to be the optimum range of angles for the cavity arms. The exact angle which is optimum for a given gain medium will depend on factors including the gain medium utilized and the diffusion length of the medium.

For spatial hole burning to affect the gain, it is required that the width w of the gain medium be wider than at least one light or one dark area in the interference pattern. For the diode laser array previously described, a suitable width has been found to be approximately 400 micrometers. The gain medium should also be wide enough to permit beams to enter and leave from both cavity arms. The desired minimum width may be indicated as:

$$w \sim (2l/n)\sin\theta \quad (1)$$

where n equals the index of refraction of the gain medium.

From the above, it is apparent that for modes or pulse lengths of optical beams circulating in cavity arms 14 and 16 and medium 12 for which interference patterns exist, the gain will be substantially less than for pulse lengths or modes for which such interference does not occur. Therefore, since the laser tends to operate in modes having the highest gain, with the configuration shown in FIG. 1, stable operation of the laser will normally occur for modes which do not generate an interference pattern.

Figure 4:
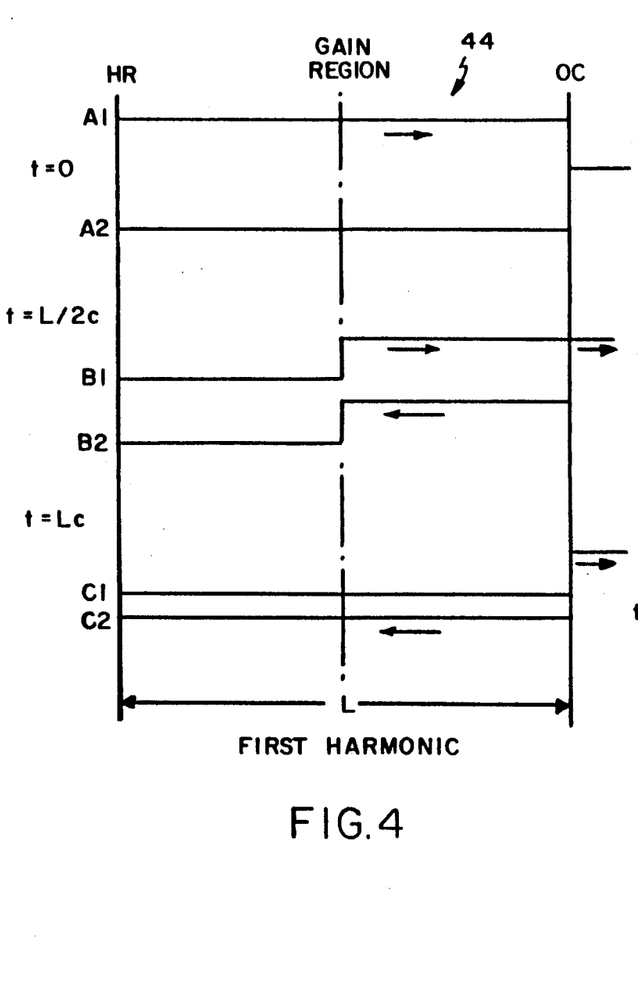
FIGS. 4 and 5 are, graphic representations of waveform propagation in the laser cavity of this invention for a first harmonic and seventh harmonic, respectively, at various successive time points.

FIG. 4 illustrates one mode for which this result is achieved. In FIG. 4, the laser cavity which is formed between output coupler 24 and high reflection mirror 26, which laser cavity extends in either direction from output coupler 24 through arm 14, through gain medium 12 to high reflection facet 40, and then back through gain medium 12 and cavity arm 16 to mirror 26, is shown stretched out as a straight line. Since the length of each of the arms 14 and 16 is in the tens of centimeters range, approximately 30 centimeters for a preferred embodiment, while the length of laser medium 12 is only approximately 500 micrometers, for the preferred embodiment, the combined length of approximately one millimeter of the passage of the beam through medium 12 represents only a very short portion of the total length L of the laser cavity 44. From FIG. 4, it is seen that if the length of each pulse is equal to the length L of cavity 44 (i.e., the pulse wavelength equals 2L), the pulse length thus being approximately 60 centimeters for the illustrative embodiment described above, then pulses will never be simultaneously traveling in opposite directions through the portion of the cavity in which array 12 is situated.

This is illustrated in FIG. 4 for three illustrative time points. At time $t=0$, the pulse fills cavity 44 traveling in a direction from high reflection mirror 26 to output coupler 24 as illustrated by line A1 of FIG. 4. There is no pulse at the output from the output coupler at this time. Line A2 also indicates that there is no pulse traveling in the direction from the output coupler to the high reflection mirror at this time.

Figure 3:
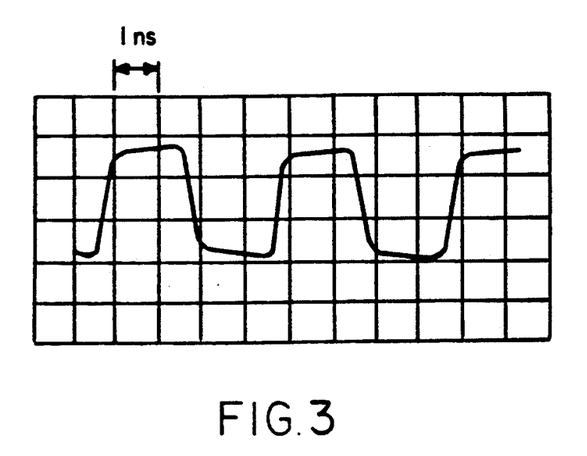
FIG. 3 is a graphic representation of square wave optical pulses obtained utilizing an optical system of the type shown in FIG. 1.

One-half pulse time later, at time $t=L/2c$, where c is the speed of light, the pulse traveling toward the output coupler is only in arm 14 of the laser cavity. As seen on line B1, this pulse is also being outputted through output coupler 24. Similarly, as shown on line B2, the return pulse from output coupler 24 is also only in cavity arm 14. In an ideal case used for purposes of illustration in FIG. 4, the pulses have infinitely rapid risetimes; however as can be seen in FIG. 3, which illustrates actual output pulses obtained utilizing a system such as that shown in FIG. 1, there are finite rise and fall times of durations generally less than 200 ps. Therefore, at the point in time shown on line B2 in FIG. 4, there may be some slight overlap of beam 34 and 36 traveling in both directions in gain medium 12. This results in a small spatial-hole-burning producing interference pattern which produces a reduction of gain for the leading and trailing edges of the pulses in beams 34 and 36. It is this small gain reduction which produces the pulse shaping effects, resulting in the desired fast rise and fall times. If the leading or trailing edges of the pulses begin to develop longer rise or fall times, then the spatial overlap increases, thereby increasing the spatial hole burning and the gain reduction. This favors the generation of fast rise and fall time pulses of length L where there is minimal overlap of leading and trailing edges in the gain.

Lines C1 and C2 show the condition one-half pulse width later at time $t=L/c$. As illustrated by line C1, the pulse traveling in the direction of the output coupler is fully outputted from laser cavity 44 at this time and, as illustrated by line C2, the pulse traveling in the direction from the output coupler to the high reflection mirror completely fills the laser cavity. At all other times, pulses in the laser cavity are at positions intermediate to those shown in FIG. 4. Thus, for pulses of such length, the pulses will never overlap in gain medium 12, an interference pattern will not be generated and there will, therefore, be no spatial hole burning effect.

Figure 5:
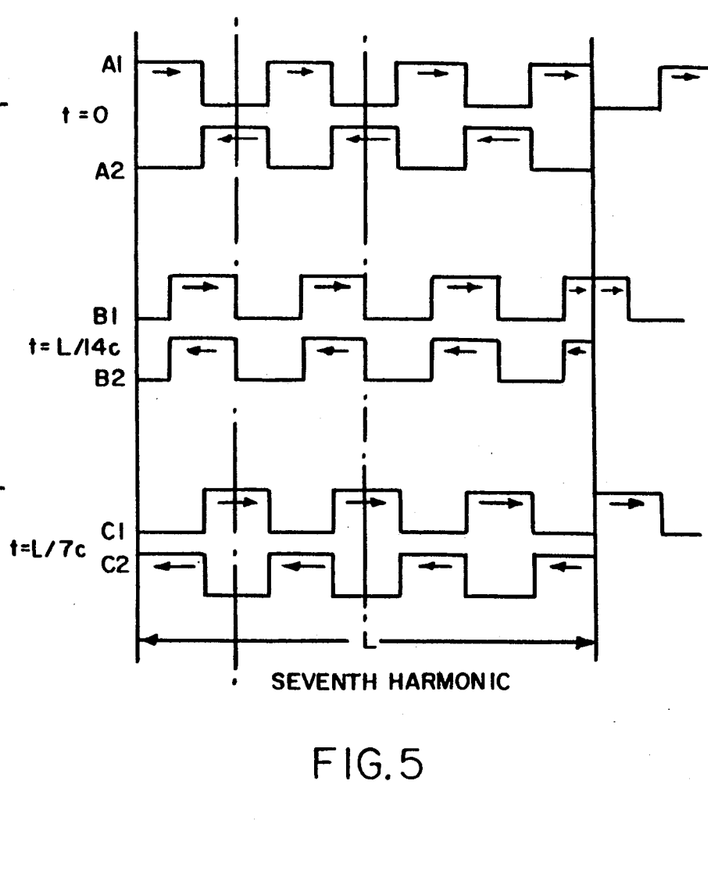

FIG. 5 illustrates directions of pulse travel in laser cavity 44 for the seventh harmonic of the pulse shown in FIG. 4 (i.e. a pulse having a length of L/7). From FIG. 5, it is seen that, at the three indicated times, there is no overlap of pulses traveling in different directions in gain medium 12. Thus, at time $t=0$, the pulse passing through the medium is traveling in the direction from the output coupler to the high reflection mirror. At time $t=L/14c$, pulses are traveling in opposite directions in cavity arm 16 and there is no interference pattern causing overlap in gain medium 12 for the same reasons discussed in conjunction with lines B1 and B2 of FIG. 4. At time $t=L/7c$, as illustrated on lines C1 and C2, a pulse is traveling in the gain medium only in the direction toward the output coupler and not in the opposite direction. Again, for all other time periods, the pulses are either at the positions shown in FIG. 5 or at intermediate positions.

From FIG. 5, it is seen that for the seventh harmonic, the gain medium need not be positioned only at the center of laser cavity 44, with the lengths of the two cavity arms being equal, but that the same result will be achieved if the laser cavity is at any one of the other six transition points on lines B1 and B2. Thus, the length of cavity arm 16 could be L/14, 3L/14, 5L/14, 7L/14, 9L/14, 11L/14 or 13L/14. The length of cavity arm 14 would in each instance be the complement of the length of cavity 16 so that the combined lengths of the two cavities would always be substantially equal to L, differing generally by twice the length of gain medium 12, and gain medium 12 would also be located at the junction of the two cavity arms.

While FIGS. 4 and 5 illustrate the situation for the first and seventh harmonics, the same results would be achieved for any odd harmonic of a pulse having the pulse width L. The number of locations along laser cavity 44 where gain medium 12 could be positioned while still achieving the desired effect of not having interference pattern causing overlap in the gain medium is for each harmonic equal to h, where h is the harmonic number. The valid positions for the gain medium in the cavity would be at the center of the cavity and at $(h-1)/2$ positions spaced on either side of the cavity center by multiples of the pulse width.

Thus, since a laser will generally operate in the mode for which gain is highest, since spatial hole burning reduces gain, and since the only pulses or mode for which spatial hole burning will not occur for the system of FIG. 1 is for pulses of length L or an odd submultiple thereof, the system will operate in a mode with pulses of such length and will generate output pulses of such length through output coupler 24. However, there is a question of which harmonic the system will operate in for a given cavity length and thus the length of the actual output pulses generated. There are at least five ways in which the system can be "tuned" to a desired harmonic pulse length of the cavity length L.

First, as discussed above, the desired effect can be achieved with the gain medium at any one of h positions along the laser cavity for harmonic h. However, most of these positions will only permit stable operation for a single harmonic. Thus, referring to FIG. 5, if the gain medium is positioned at position P' with cavity arm 16 being of length 3L/14 and cavity arm 14 being of length 11L/14, the system should only operate with pulses of the seventh harmonic length shown in FIG. 5. The next harmonic at which it could operate stably would be the 21st harmonic, which suggests that the system would probably operate stably at the seventh harmonic.

A second way in which to control the harmonic being outputted is by making slight angular changes in output coupler 24 and/or high reflection mirror 26. It has been found empirically that very slight changes in the angles of these two elements can be utilized to control the pulse width harmonic being outputted.

Further, as shown in FIG. 1, an external cavity 28 at the output from output coupler 24 may be utilized to "tune" the harmonic being outputted from system 10. The length of external cavity 28 would be adjusted to be equal to the pulse length of the desired harmonic and this has been found to force the system into operation at the desired harmonic. A fourth tuning technique, using a weak partial reflector in a cavity arm is discussed in conjunction with FIG. 6. All of these tuning techniques favor selections of a higher harmonic.

Where a lower harmonic is required, either the lowest possible harmonic square wave for a given cavity configuration or a lower harmonic of harmonics available from a laser cavity employing one of the earlier-mentioned tuning techniques, such lower or lowest harmonic may be selected by using a suitable intracavity tuning element to restrict the laser bandwidth. This tuning element is chosen to have a bandwidth or attenuation which is tailored to favor the spectral profile of that harmonic. For the case of 100 MHz repetition rate square waves, the third and high odd harmonics may be discriminated against using an intracavity Fabry Perot etalon along with other turning elements such as a multiple plate birefringent filter which selects nearly single mode operation.

FIGS. 6-9 illustrate various alternative embodiments of the invention. To simplify the drawings for these embodiments, lenses 20 and 22 and filter 23 have not been shown in these figures. However, it is to be understand that these elements would normally be present for the alternative embodiments as required.

Figure 6:
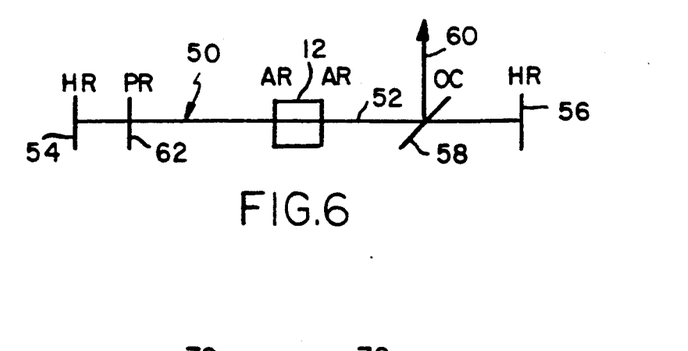
FIG. 6 is a simplified block diagram of a linear cavity optical system employing the teachings of this invention and having an optical coupler in one of the cavity arms.

For the embodiment of FIG. 6, the cavity arms 50 and 52 extend in opposite directions from gain medium 12. gain medium 12 having an anti-reflection coating on both its front and rear facets. Cavity arms 50 and 52 are terminated at their distal ends by high reflection mirrors 54 and 56, respectively. An output coupler 58 which produces an output beam 60 is positioned in arm 52.

The embodiment of FIG. 6 would not normally operate with a diode laser gain medium because the hole burning effect would not persist with the cavity arms at the angles shown. However, such a configuration might be suitable for generating square wave pulses with a solid state gain medium, for example, a Ti-sapphire laser. The distance between mirrors 54 and 56 would be the length L previously discussed. The location of output coupler 58 could be in either arm 50 or 52 and is not critical. Further, the positioning of the output coupler 58 in a cavity arm rather than at the distal end thereof as shown in FIG. 6 is not limited to this embodiment of the invention, and the output coupler may be positioned in this way for any of the embodiments shown.

Tuning for the embodiment shown in FIG. 6 is achieved through use of a weak partial reflector 62 which is located in cavity arm 50 at a position which is spaced from medium 12 by a multiple of the desired pulse length. Partial reflector 62 might be placed at the indicated position in either cavity arm. This technique for tuning may also be utilized with any of the other embodiments having a beam traveling in both directions through a cavity arm and operates to force the system into operation in a desired pulse length mode in much the same way as output cavity 28 in FIG. 1. Finally, with the embodiment shown in FIG. 6, gain reduction may occur as a result of a saturation effect other than spatial hole burning such as saturation as a result of coherent beam addition. For example, the entire gain medium may become saturated. However, the generation of square waves of a desired pulse length as a result of gain reduction at other pulse lengths can be achieved with any form of gain reduction in the gain medium and is not limited to the spatial hole burning effect.

Figure 7:
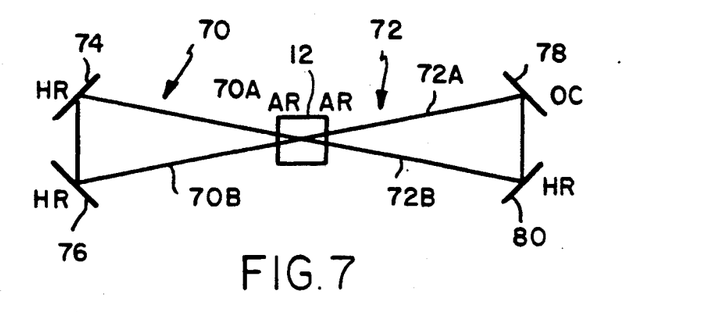
FIG. 7 is a simplified block diagram of an alternative embodiment of the invention having an X configuration of laser cavity arms.

FIG. 7 illustrates another embodiment of the invention wherein the cavity arms 70 and 72 each has two legs, 70A, 70B and 72A, 72B, respectively. Leg 70A terminates at its distal end in a high reflection mirror 74 which reflects light to a high reflection mirror 76 at the distal end of leg 70B. Similarly, leg 72A terminates in output coupler 78 which reflects light to high reflection mirror 80. Both the front and rear facets of gain medium 12 have anti-reflection coatings. The angle between legs 70A and 70B and between legs 72A and 72B is equal to $2\theta$, and the total round trip optical path length for a pulse from any point on the looped optical path of FIG. 7 is equal to 2L. This optical path includes not only legs 70A, 70B, 72A, 72B and gain medium 12, but also includes the path portions between mirrors 74-76 and between mirrors 78-80.

The embodiment of FIG. 7 operates in much the same way to achieve pulse operation as for the embodiment of FIG. 1 except that beams travel through the anti-reflection coated rear facet of gain medium 12 rather than being reflected therefrom and beams travel in only a single direction through a given leg of the cavity arms rather than traveling in both directions through a cavity arm having a single leg. The embodiment of FIG. 7 (and of FIG. 8) requires the inclusion of a suitable element (not shown) to assure that the beam is traveling in a desired direction (clockwise or counterclockwise) through the laser cavity.

Figure 8:
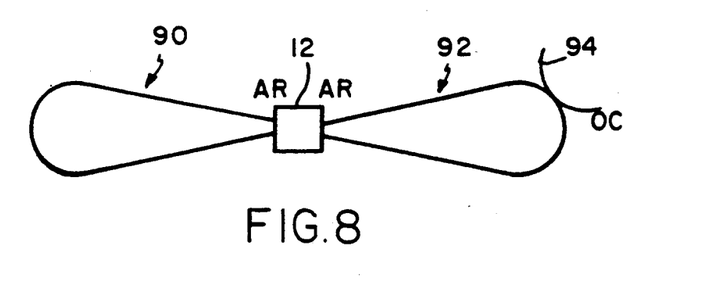
FIG. 8 is a simplified block diagram of an optical system utilizing the teachings of this invention and having a looped cavity arm configuration.

FIG. 8 shows still another embodiment of the invention wherein the cavity arms 90 and 92 are each in the form of an optical waveguide loop with an output coupler 94 being provided at a selected position in one of the loops. Optical waveguide loops 90 and 92 may, for example, be formed of a fiber optic material or the optical waveguides could be internal to a chip, for example, a channel etched in the chip. Except for the path of the light beam being controlled by an optical waveguide rather than by mirrors, the embodiment of the invention shown in FIG. 8 operates in the same manner as that shown in FIG. 7.

While an optical waveguide has been shown only for the loop configuration of FIG. 8, it should be understood that an optical waveguide can be utilized for the other embodiments of the invention, with mirrors being placed at the distal end of each waveguide, rather than having the waveguide looped. While normally a waveguide would not be required for the other configurations, coherent light from a laser traveling in a straight line over substantial distances through open space, using an optical waveguide may be preferable, particularly where the cavity arms are relatively long, since vibration of the device or thermal drift may destabilize operation in an open space environment which would not be a problem when an optical waveguide is utilized.

Figure 9:
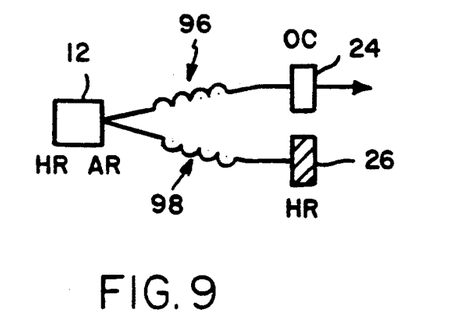
FIG. 9 is a simplified block diagram of still another embodiment of the invention employing a coiled optical waveguide in the cavity arms.

FIG. 9 illustrates another potential advantage of utilizing an optical waveguide, particularly a fiber optic waveguide, in that the fiber optic waveguide may be coiled without interfering with the optical path of travel. This permits a far more compact construction of the system than for example that shown in FIG. 1, and may be desirable, particularly when the cavity arms 96 and 98 are relatively long. Except for the use of a coiled waveguide in the cavity arms, the embodiment of FIG. 9 is identical to that shown in FIG. 1 and operates in identical fashion.

A system has thus been provided which is completely passive and is, therefore, simple and inexpensive to build and operate and which permits fast rise time optical pulse trains to be generated at a variety of different pulse widths. A first level of tuning for the system is achieved by selecting the lengths of cavity arm, for example, 14 and 16, to achieve a desired laser cavity length L. Depending on the desired harmonic of the pulse repetition frequency, the cavity arms may be of complementary length to achieve the desired harmonic output or cavity arms of equal length may be utilized and mirror output coupler tilting, external cavity 28 or weak partial reflector 82 may be utilized to tune the cavity for a desired harmonic pulse width. The system inherently generates pulses with fast rise and fall times, which may be less than 200 ps. Output couplers having a reflectivity from 40% to 90% have been successfully utilized. Again, while this is believed to be the preferred range for the output coupler, it is by no means a limitation on the invention.

For cavities of the lengths previously indicated, a frequency of operation for first harmonic square wave pulses of 250 MHz have been achieved. Higher frequencies can be achieved with various odd harmonics. These pulses are envelope pulses for a high frequency, generally sine wave, signal at the operating frequency of the laser medium. The output frequency of the laser gain medium 12 can be highly monochromatic, resulting in an optical square wave that is Fourier transform limited. Higher or lower pulse repetition frequencies can be achieved by shortening or lengthening the laser cavity, respectively. With a longer laser cavity, frequencies as low as 80 MHz have been observed. The limitations on frequencies obtainable are generally practical considerations on cavity length.

While the invention has been described above with respect to preferred embodiments, it is apparent that the foregoing and other changes in form and detail may be made therein by one skilled in the art without departing from the spirit and scope of the invention.

What is claimed is:

1. An optical pulse generator for pulses of a desired pulse width comprising
   a laser gain medium;
   a first cavity arm and a second cavity arm oriented relative to the gain medium and to each other so that a gain reduction effect persists in said gain medium when optical beams enter the gain medium from both arms simultaneously;
   optical feedback means in each cavity arm; and
   output coupling means in at least one of said cavity arms;
   the gain medium and the two cavity arms being further oriented to form a laser cavity having a length substantially equal to an odd multiple (h) of said pulse width, the relative lengths of said cavity arms being such that the gain medium is at a point in the laser cavity spaced from the center thereof by a multiple from zero to $(h-1)/2$ of said pulse width.

2. A generator as claimed in claim 1 wherein a output coupler is at a distal end of one of said cavity arms, and wherein a high reflection mirror is at a distal end of the other cavity arm.

3. A generator as claimed in claim 1 including means for collimating the output from the gain medium.

4. A generator as claimed in claim 1 including means for mode matching the output from the gain medium to the cavity arms.

5. A generator as claimed in claim 1 including means for optically filtering the output from the gain medium.

6. A generator as claimed in claim 1 wherein said cavity arms extend from the medium at angles of $+\theta$ and $-\theta$, respectively to a collinear axis of the medium.

7. A generator as claimed in claim 6 wherein the angle $\theta$ is in the range from 6° to 25°.

8. A generator as claimed in claim 1 wherein the gain reduction effect is spatial hole burning, and wherein the width of the gain medium is sufficient to permit the hole burning effect to affect the gain.

9. A generator as claimed in claim 8 wherein the gain medium has a facet adjacent the cavity arms with a minimum width of $(2l/n)$ sing, where l is the length of the gain medium and n is the index of refraction of the gain medium.

10. A generator as claimed in claim 1 wherein said gain medium is a diode laser array having an anti-reflection coating on the face thereof adjacent the cavity arms.

11. A generator as claimed in claim 10 wherein the face of said gain medium opposite the anti-reflection coated face has a high reflection coating.

12. A generator as claimed in claim 1 wherein said cavity arms are of substantially equal length, resulting in said gain medium being at the center of the laser cavity.

13. A generator as claimed in claim 1 including means for controlling the odd harmonic, and thus the pulse width, for a laser cavity of a given length.

14. A generator as claimed in claim 13 wherein said optical feedback means for a cavity arm may be one of a high reflection mirror or output coupler at the distal end of the arm, and wherein said means for controlling includes means for adjusting the angle of at least one of said feedback means.

15. A generator as claimed in claim 13 wherein said means for controlling includes an external cavity of a length equal to said pulse width extending from said output coupler.

16. A generator as claimed in claim 13 wherein said means for controlling includes a weak partial reflector in at least one of said cavity arms and spaced from the gain medium by a multiple of said pulse width.

17. A generator as claimed in claim 13 wherein said means for controlling includes a tuning element in at least one of said cavity arms.

18. A generator as claimed in claim 1 wherein said pulses are optical square wave pulses.

19. A generator as claimed in claim 18 wherein said pulses have rise times of less than 200 ps.

20. A generator as claimed in claim 1 wherein said arms are formed by a length of free space.

21. A generator as claimed in claim 1 wherein at least one of said cavity arms is formed by an optical waveguide.

22. A generator as claimed in claim 21 wherein said optical waveguide is a coiled optical fiber.

23. A generator as claimed in claim 21 wherein said optical waveguide is looped.

24. A generator as claimed in claim 21 including an optical feedback means at the distal end of at least one of said optical waveguides.

25. A generator as claimed in claim 1 wherein said gain medium has anti-reflection coatings on both its front and rear facets, one of said cavity arms extending from the front facet and the other cavity arm extending from the rear facet.

26. A generator as claimed in claim 25 wherein each of said cavity arms is in the form of a loop having first and second legs, the legs of a given arm extending from the medium at angles of $+\theta$ and $-\theta$, respectively, to a collinear axis of the medium.

27. A generator as claimed in claim 26 wherein said feedback means includes mirrors at the distal ends of each cavity arm leg, said mirrors being angled to reflect a light beam exiting from one leg of a cavity arm into the other leg of the cavity arm.

28. A generator as claimed in claim 26 wherein each of said loops is formed by an optical waveguide.

29. A generator as claimed in claim 1 wherein the laser cavity has a length which is many times greater than the length of the gain medium, so that pulses are in the gain medium for only a very small fraction of their travel time to the laser cavity.

* * * * *

UNITED STATES PATENT AND TRADEMARK OFFICE
CERTIFICATE OF CORRECTION

PATENT NO. : 5,093,833
DATED : March 3, 1992
INVENTOR(S) : L. Y. Pang et al

It is certified that error appears in the above-identified patent and that said Letters Patent is hereby corrected as shown below:

Column 1, line 5

--This invention was made with government support under Contract No. F19628-90-C-0002 by the Air Force. The Government has certain rights in the invention.--

Signed and Sealed this

Twenty-sixth Day of October, 1993

Attest:

BRUCE LEHMAN

Attesting Officer       Commissioner of Patents and Trademarks